(12) United States Patent
Zhan et al.

(10) Patent No.: US 8,994,068 B2
(45) Date of Patent: Mar. 31, 2015

(54) ESD PROTECTION DEVICE

(75) Inventors: Rouying Zhan, Gilbert, AZ (US); Chai E Gill, Chandler, AZ (US); Changsoo Hong, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/599,244

(22) Filed: Aug. 30, 2012

(65) Prior Publication Data

US 2014/0061716 A1    Mar. 6, 2014

(51) Int. Cl.
*H01L 29/66* (2006.01)
*H01L 23/62* (2006.01)
*H01L 27/02* (2006.01)
*H01L 21/425* (2006.01)
*H01L 29/87* (2006.01)

(52) U.S. Cl.
CPC ............ *H01L 29/87* (2013.01); *H01L 27/0262* (2013.01)
USPC ........... 257/173; 257/328; 257/355; 257/360; 257/546; 438/526

(58) Field of Classification Search
None
See application file for complete search history.

(56) References Cited

U.S. PATENT DOCUMENTS

| | | | |
|---|---|---|---|
| 6,441,437 B1 * | 8/2002 | Gossner | 257/355 |
| 7,427,787 B2 | 9/2008 | Steinhoff | |
| 2004/0135141 A1 * | 7/2004 | Pequignot et al. | 257/46 |
| 2008/0088993 A1 * | 4/2008 | Entringer et al. | 361/56 |
| 2011/0176243 A1 * | 7/2011 | Zhan et al. | 361/56 |
| 2011/0176244 A1 * | 7/2011 | Gendron et al. | 361/56 |
| 2012/0133025 A1 * | 5/2012 | Clarke et al. | 257/570 |

OTHER PUBLICATIONS

H. Gossner, T. Muller-Lynch, K. Esmark, and M. Stecher, Wide Range Control of the Sustaining Voltage of ESD Protection Elements Realized in a Smart Power Technology, EOS/ESD Symposium 99-19.

* cited by examiner

*Primary Examiner* — Mohammad Islam
*Assistant Examiner* — Jay C Chang

(57) ABSTRACT

An electrostatic discharge protection clamp adapted to limit a voltage appearing across protected terminals of an integrated circuit to which the electrostatic discharge protection clamp is coupled is presented. The electrostatic discharge protection clamp includes a substrate, and a first electrostatic discharge protection device formed over the substrate. The first electrostatic discharge protection device includes a buried layer formed over the substrate, the buried layer having a first conductivity type and defining an opening located over a region of the substrate, a first transistor formed over the opening of the buried layer, the first transistor having an emitter coupled to a first cathode terminal of the electrostatic discharge protection clamp, and a second transistor formed over the buried layer, the second transistor having an emitter coupled to a first anode terminal of the electrostatic discharge protection clamp.

19 Claims, 6 Drawing Sheets

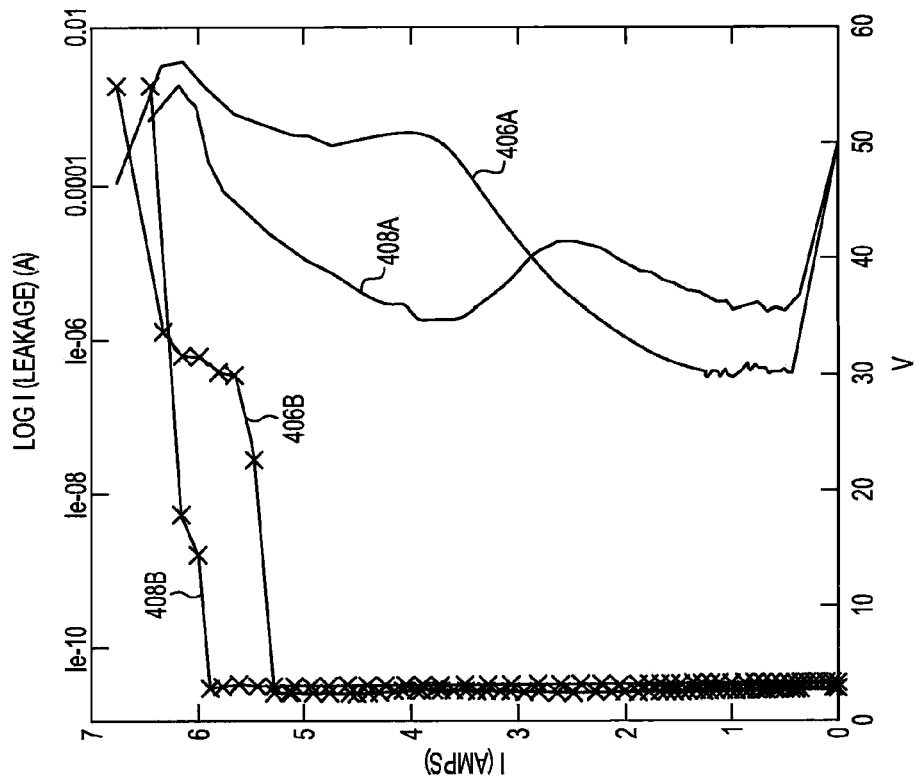
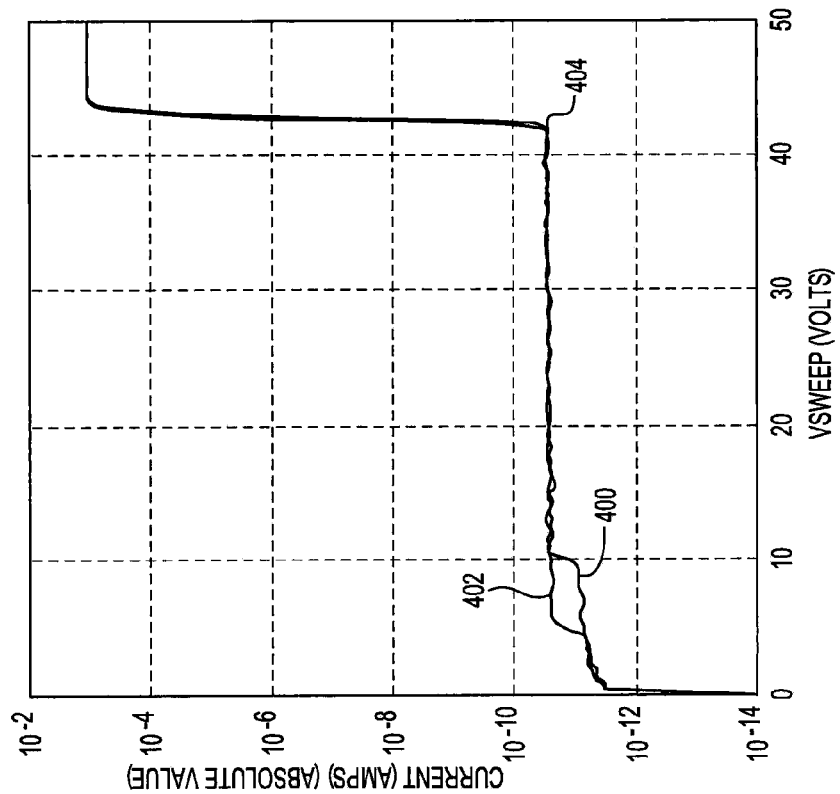
FIG. 4B
FIG. 4A

US 8,994,068 B2

ESD PROTECTION DEVICE

FIELD OF USE

The present disclosure relates generally to semiconductor devices, and more specifically, to semiconductor devices providing protection from electrostatic discharge (ESD).

BACKGROUND

Modern integrated circuits (ICs) and electronic assemblies, and the devices therein, are at risk of damage due to electrostatic discharge (ESD) events. This is well known in the art. Accordingly, it is commonplace to provide an ESD protection clamp (voltage limiting device) across the terminals of such devices, IC's and electronic circuits or assemblies. As used herein, the term integrated circuit and the abbreviation IC are intended to refer to any type of circuit or electronic assembly whether formed in a monolithic substrate or as individual elements or a combination thereof.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, where:

FIGS. 4A and 4B are graphs showing test results for a conventional double-stack ESD protection device including a full NBL and a double-stack ESD protection device configured in accordance with the present disclosure and including a partial NBL.

DETAILED DESCRIPTION

Figure 1:
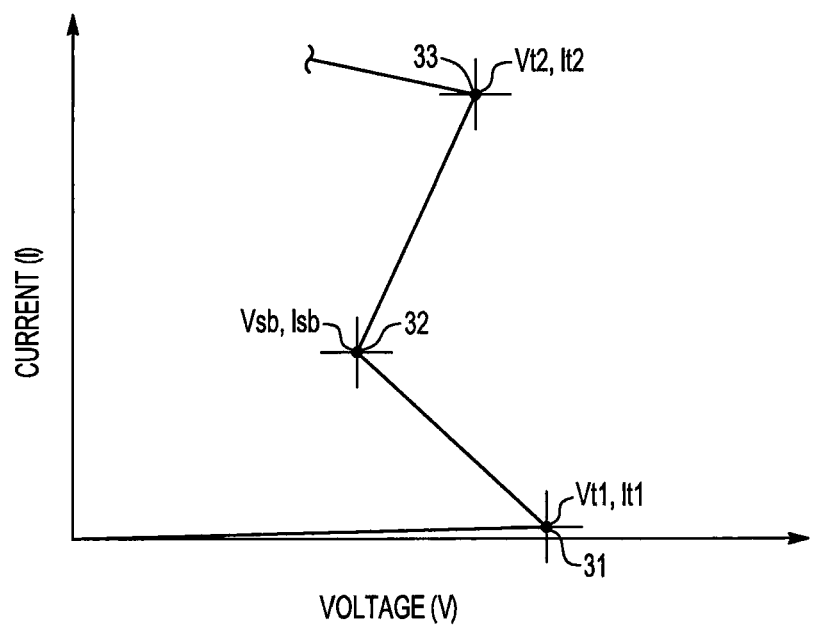
FIG. 1 is a graph showing a transmission line pulse (TLP) current (I) versus voltage (V) for a typical electrostatic discharge (ESD) protection device.

The following detailed description is exemplary in nature and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the term "semiconductor" is intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures as for example and not intended to be limiting, semiconductor-on-insulator (SOI) structures, and combinations thereof. For convenience of explanation and not intended to be limiting, semiconductor devices and methods of fabrication are described herein for silicon semiconductors but persons of skill in the art will understand that other semiconductor materials may also be used. Additionally, various device types and/or doped semiconductor regions may be identified as being of N type or P type for convenience of description and not intended to be limiting, and such identification may be replaced by the more general description of being of a "first conductivity type" or a "second, opposite conductivity type" where the first type may be either N or P type and the second type then is either P or N type.

In one implementation, the present invention is an electrostatic discharge protection clamp adapted to limit a voltage appearing across protected terminals of an integrated circuit to which the electrostatic discharge protection clamp is coupled. The clamp includes a substrate, and a first electrostatic discharge protection device formed over the substrate. The first electrostatic discharge protection device includes a buried layer formed over the substrate, the buried layer having a first conductivity type and defining an opening located over a region of the substrate, a first transistor formed over the opening of the buried layer, the first transistor having an emitter coupled to a first cathode terminal of the electrostatic discharge protection clamp, and a second transistor formed over the buried layer, the second transistor having an emitter coupled to a first anode terminal of the electrostatic discharge protection clamp.

In another implementation, the invention is a method of manufacturing an electrostatic discharge protection clamp adapted to limit a voltage appearing across protected terminals of an integrated circuit to which the electrostatic discharge protection clamp is coupled, comprising providing a substrate including a buried layer, the buried layer having a first conductivity type and defining an opening located over a region of the substrate, forming a first transistor over the opening of the buried layer, the first transistor having an emitter coupled to a cathode terminal of the electrostatic discharge protection clamp, and forming a second transistor over the buried layer, the second transistor having an emitter coupled to an anode terminal of the electrostatic discharge protection clamp.

ESD protection clamps are circuit elements used to protect integrated circuit (IC) devices from voltage and current spikes that may be associated with an electrostatic discharge. To protect an IC device, an ESD clamp is connected between an input or output terminal of the device and a ground or common terminal. During normal operation, the ESD clamp does not conduct. But when subjected to an excessive voltage, the ESD clamp becomes conductive, conducting current to ground and limiting voltage to desired safe level, thereby protecting the IC to which the ESD clamp is connected.

Generally, ESD clamps can be connected across any terminals of an IC that constitutes the electronic device to be protected. Accordingly, any reference herein to a particular input or output terminal of an IC is intended to include any and all other terminals of electronic circuits, not merely those used for input or output signals. With respect to structures or elements used for ESD protection, the terms device, clamp and transistor are used interchangeably.

FIG. 1 is a graph showing a transmission line pulse (TLP) current (I) versus voltage (V) for a typical electrostatic discharge (ESD) protection device. In operation, as the voltage applied to the terminals is increased, very little current flows through the ESD protection device until the triggering voltage Vt1 at point 31 is reached. It should be noted that within the present disclosure the value Vt1 refers to forward triggering voltage, unless otherwise specified. With the increased current, the device reaches a snapback point indicated by point 32 of FIG. 1. At point 32, the voltage across the ESD protection device is Vsb and the current flowing through the device is Isb. In high-voltage or higher-power ESD clamp implementations (e.g., those used in the automotive industry) ESD clamps having a higher snapback voltage (Vsb) generally provide improved latch-up immunity.

Depending upon the internal impedance of the voltage source, current and voltage may further increase to point 33 at current It2 and voltage Vt2, beyond which destructive failure may occur leading to further current increase accompanied by voltage decrease. Generally, It2 indicates the current capability of the ESD protection device before the device is thermally damaged.

ESD protection devices are generally non-conductive during normal operation of the connected IC device being protected. However, when the connected IC device is subjected to an excessive voltage (that is similarly subjected to the ESD protection device), the ESD protection device turns on, becoming conductive and thereby preventing damage to the protected device. The triggering voltage $V_{t1}$ of the ESD protection device is generally selected to exceed the maximum normal DC operating voltage of the protected device. Additionally, $V_{t1}$ is selected to be less than the lowest transient voltage that may cause damage to the protected device. When protecting a device having a number of terminals, ESD protection devices may be connected across each terminal and a ground terminal to provide comprehensive protection to the IC.

Figure 2:
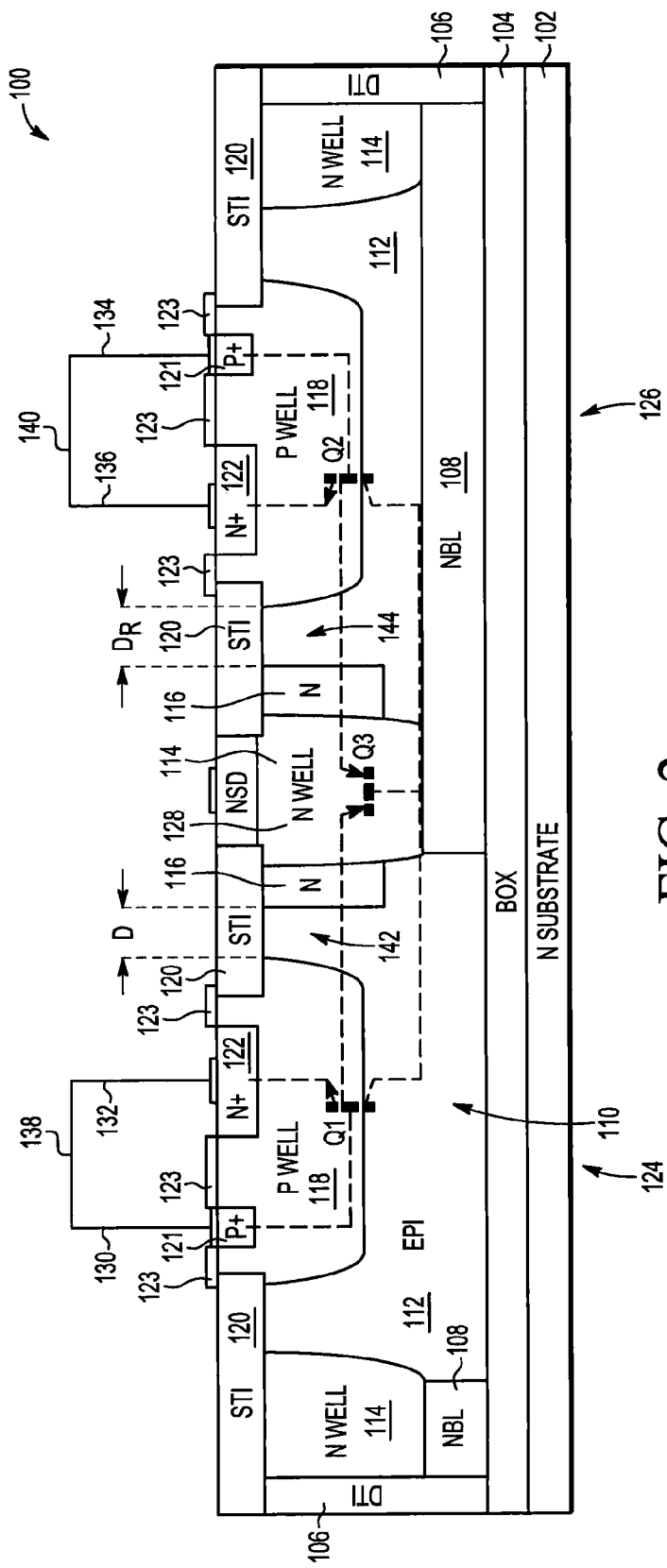
FIG. 2 is a cross-sectional view of the present ESD protection device implemented in a semiconductor substrate according to an embodiment of the present invention.

FIG. 2 is a cross-sectional view of ESD protection device 100 implemented in a semiconductor substrate according to an embodiment of the present invention. ESD protection device is a dual polarity (bi-directional) ESD clamp device for use in protecting electronic devices and circuits. As described below, the ESD protection device includes two mirrored and interconnected transistors 124 and 126 and may be incorporated into an ESD protection clamp.

ESD protection device 100 is formed over substrate 102. The initial substrate 102 is provided with buried oxide layer (BOX) 104. Depending upon the implementation, substrate 102 may be either of N-type or P-type. Buried oxide layer 104 provides electrical isolation to devices formed over substrate 102. In some implementations of ESD protection device 100, however, BOX layer 104 may be excluded. For example, if there is no requirement that ESD protection device 100 be stackable (stacked configurations of multiple ESD protection devices are described below), BOX layer 104 is not required because the electric isolation provided by BOX layer 104 is not as important.

N-type (or, alternatively, P-type) buried layer (NBL) regions 108 are formed over buried oxide layer 104. NBL 108 may be doped with antimony, phosphorus, or suitable combinations thereof. The peak doping density for NBL 108 is in the range of about $1\times10^{16}$ cm$^{-3}$ to about $1\times10^{19}$ cm$^{-3}$. NBL 108 may have a thickness (t) in the range of 1 micrometer (μm) to about 4 μm, and is located at a depth below the surface of ESD protection device 100 ranging from about 1.5 μm to 7 μm. But other dopants, concentrations, thicknesses and depths may also be used.

As shown in FIG. 2, NBL 108 is not contiguous through ESD protection device 100. Instead, NBL 108, once formed, defines a portion or region 110 wherein buried oxide layer 104 is exposed. As such, NBL region 108 does not form a continuous layer of N-type material formed across the surface of buried oxide layer 104. Consequently, as additional layers of material are formed over substrate 102, those layers of material may contact a surface of buried oxide layer 104.

NBL 108 can be formed using any suitable process. In one implementation, NBL region 108 is formed by an implantation process that relies upon a mask that causes regions 108 of NBL region 108 to be implanted, while at the same time defining opening 110 of NBL 108.

Region 112 is formed over NBL 108 and buried oxide layer 104. As shown in FIG. 2, where region 112 is formed over the entire device including the portion 110 with no NBL 108. For the portion 110 of the device region 112 comes into contact with buried oxide layer 104. In one implementation, region 112 is formed by epitaxial deposition and may be either N-type or a P-type doped (P-type is shown in FIG. 2). An example doping concentration range of region 112 is about $1\times10^{15}$ cm$^{-3}$ to about $8\times10^{15}$ cm$^{-3}$. As such, region 112 may be relatively lightly doped. The depth of region 112 is usually in the range of 3 μm to about 9 μm in some embodiments.

Within region 112, a number of N-well regions 114 are formed. N well regions 114 may be doped with arsenic, phosphorus, antimony, or suitable combinations thereof. The peak doping density for N-well regions 114 is usually in a range of about $1\times10^{17}$ cm$^{-3}$ to about $1\times10^{19}$ cm$^{-3}$ although other doping densities may also be used N-well regions 114 are formed to be in contact (and, therefore, in electrical communication with) NBL 108.

A number of shallow trench isolation (STI) structures 120 are formed over a surface of device 100. The depth of STI structures 120 is usually in the range of about 0.05 µm to about 1 µm, more conveniently about 0.2 µm to about 0.5 µm, although thicker or thinner STI structures may also be used.

To fully isolate devices formed over substrate 102, deep trench isolation (DTI) regions 106 are formed to provide electrically insulating walls around the devices. DTI regions 106 comprise dielectric materials that provide lateral electrical isolation to the device. Deep trench isolation regions are provided extending from surface to buried oxide layer 104.

N-type regions 116 are formed in communication with N-well regions 114. N-type regions 116 may be doped with arsenic, phosphorus, or suitable combinations thereof at a peak concentration that is equal to, or lighter than, the doping of N-well regions 114. The depth of N-type regions 116 may be in the range of 0.3 µm from the surface of device 100, to any location above or in contact with NBL 108, but other depths may also be used.

P-well regions 118 are formed within region 112. P-well regions 118 may be doped with boron or other suitable dopants. The peak doping density for P-well regions 118 is in the range of about $1\times10^{16}$ cm$^{-3}$ to about $1\times10^{19}$ cm$^{-3}$. The depth of P-well regions 118 may be in the range of 0.3 µm from the surface of device 100, to any location above or in contact with NBL 108, but other depth may also be used.

A number of silicide block regions 123 can be formed over the surface of device 100 to prevent reaction with a silicide forming conductor (that may be deposited over the device at a later time). In one embodiment, the silicide block regions 123 comprise a first layer of silicon oxide overlaying the surface, followed by a second layer of silicon nitride overlapping the first layer. While in another embodiment, the silicide block regions 123 may be omitted. In some cases, the silicide block regions 123 are replaced using shallow trench isolation (STI).

N+ doped contact regions 122 are formed in P-well regions 118. N+ contact regions 122 include relatively shallow, but highly doped N-type regions and may include phosphorus, arsenic, or suitable combinations thereof as dopants. The peak doping density for N+ contact regions 122 can be in the range of about $5\times10^{19}$ cm$^{-3}$ to about $1\times10^{21}$ cm$^{-3}$. The depth of N+ contact regions 122 can range from about 0.05 µm to about 0.3 µm. Other dopants, density and depths, though, may also be used.

P+ doped contact regions 121 are formed in P-well regions 118 to make electrical contact with P-well regions 118. P+ contact regions 121 include relatively shallow, but highly doped P regions and may include boron as a dopant. The peak doping density for P+ contact regions 121 is in the range of about $5\times10^{19}$ cm$^{-3}$ to about $1\times10^{21}$ cm$^{-3}$. The depth of P+ contact regions 120 can range from about 0.05 µm to about 0.3 µm. But other dopants, density and depths may also be used.

In the configuration shown in FIG. 2, the structure forms two NPN bipolar junction transistors 124 and 126. To illustrate the location and electrical interconnection of transistors 124 and 126 within the device, FIG. 2 includes a dashed schematic overlay showing the approximate location of a number of transistor structures within device 100. In the overlay, transistor 124 is represented by transistor Q1 and transistor 126 is represented by transistor Q2. In FIG. 2, transistors Q1, Q2, Q3 (described below), and their interconnections are only included for reference and do not form any portion of the structure of device 100. In FIG. 2, N+ doped regions 122 serve as the emitters of transistors 124 and 126. P-well regions 118 serve as the bases of transistors 124 and 126. The N-well region 128 (and connected NBL region 108) serve as the shared collector of transistors 124 and 126. The base and emitter terminals (130 and 132, respectively) of transistor 124 are tied together to form cathode terminal 138 for ESD protection device 100. The base and emitter terminals (134 and 136, respectively) of transistor 126 are tied together to form anode 140 terminal for ESD protection device 100. In this configuration, a parasitic PNP transistor structure is formed in device 100 at the approximate location of transistor Q3 on FIG. 2. N-well region 128 and the adjoining NBL region 108 serve as the base of the transistor structure Q3, and P-well regions 118 serve as the emitter and collector of transistor structure Q3. In the present device, the portion of NBL 108 formed under transistor 126 enables the operation of the parasitic PNP transistor structure Q3.

If a positive voltage is applied to terminal 140 with respect to terminal 138, then transistor 126 acts as a forward-biased diode, and transistor 124's base-collector junction is reverse biased. When a sufficiently large voltage is applied to terminal 140 with respect to terminal 138, intermediate portion 142 of region 112 becomes depleted of free carriers and distance D represents the base-collector spacing. As the applied voltage increases to Vt1, avalanche breakdown occurs across distance D in portion 142 of region 112. Thus, the (forward) triggering voltage Vt1 at which avalanche breakdown occurs in transistor 124 can depend upon triggering spacing dimension D between P-well 118 and N-type region 116 within transistor 124; the larger spacing dimension D, the higher Vt1 and, conversely, the smaller spacing dimension D, the smaller Vt1. As the applied voltage increases above Vt1, the avalanche breakdown generates carriers turning on NPN transistor 124 (Q1). NPN transistor 124 (Q1) then couples with PNP transistor structure Q3 so that the base of transistor 124 (Q1) also serves as and connects to the collector of transistor structure Q3, and the collector of transistor 124 (Q1) serves as and connects to the base of transistor structure Q3. The coupling between transistor 124 and transistor structure Q3 forms a parasitic silicon controlled rectifier (SCR). The parasitic SCR effects provide strong current capability for the present device after the device snaps back and begins conducting.

Conversely, when a negative voltage is applied to terminal 140 with respect to terminal 138, then transistor 124 is acts as a forward-biased diode and transistor 126's base-collector junction is reverse biased. When a negative voltage with sufficiently large amplitude is applied to terminal 138 with respect to terminal 140, intermediate portion 144 of region 112 becomes depleted of free carriers and distance $D_R$ represents the base-collector spacing. As the applied voltage increases to $Vt1_R$, avalanche breakdown occurs across distance $D_R$ in portion 144 of region 110. Thus, the reverse triggering voltage $Vt1_R$ at which avalanche breakdown occurs in transistor 126 can depend upon reverse triggering spacing $D_R$ between P-well 118 and N-type region 116 within transistor 126; the larger spacing dimension $D_R$, the higher $Vt1_R$ and, conversely, the smaller spacing dimension $D_R$, the smaller $Vt1_R$. As the applied voltage increases above $Vt1_R$, the avalanche breakdown generates carriers to turn on NPN transistor 126 (Q2). NPN transistor 126 (Q2) then couples with PNP transistor structure Q3 in a way that the base of transistor 126 (Q2) also serves as and connects to the collector of transistor structure Q3, and the collector of transistor 126 (Q2) serves as and connects to the base of Q3. The coupling between transistor 126 and transistor structure Q3 also forms a parasitic SCR. The parasitic SCR effects provide strong reverse current capability for the present device after the device snaps back and start conducting.

The forward and reverse triggering voltages Vt1 and Vt1$_R$ may be substantially the same or different depending on whether forward and reverse triggering spacing D and D$_R$ are substantially the same or different.

In the arrangement shown in FIG. 2, transistor 124 controls the forward triggering of ESD protection device 100. And the parasitic SCR formed by transistor 124 and transistor structure Q3 controls the forward snapback voltage of ESD protection device 100 after the applied voltage exceeds Vt1 for the device (and so the device begins to snapback and conduct current). In a conventional dual-polarity ESD protection device with full NBL, a substantial amount of current flows through the NBL that is located under each transistor.

In contrast, in the present device, the NBL layer 108 is not present in portion 110 of NBL 108. As a consequence, after the device is triggered, no current flows through the NBL for transistor 124. This behavior increases the forward snapback voltage Vsb of the device, improving its performance and allowing the device to have a smaller footprint. The snapback voltage Vsb of the present device can be significantly varied from implementation to implementation, for example by varying doping concentration or dimensions of the elements in the device.

Because the present ESD protection device can be constructed using silicon-on-insulator fabrication process, the ESD protection device is isolated by buried oxide layer (BOX) and deep trench isolation (DTI), as described above. This configuration allows the device to be stacked. This capability minimizes device footprint when a number of the present ESD protection devices are stacked over one another. The stacking of the present ESD protection devices allows for the formation of a single ESD protection clamp that includes a number of ESD protection devices and that can provide an increased Vsb.

When stacked within an ESD protection clamp, two or more ESD protections devices are formed next to one another in a single substrate. The ESD protection devices are then connected in series (i.e., stacked) with the cathode of one ESD protection device being electrically connected to the anode of the next ESD device. The anode of the first ESD protection device in the stack provides a positive input or anode terminal for the ESD protection clamp. Similarly, the cathode of the last ESD protection device in the stack provides a negative input or cathode terminal for the ESD protection clamp. The positive and negative input terminals of the ESD protection clamp can then be connected to an IC device to provide protection thereto.

Figure 3A:
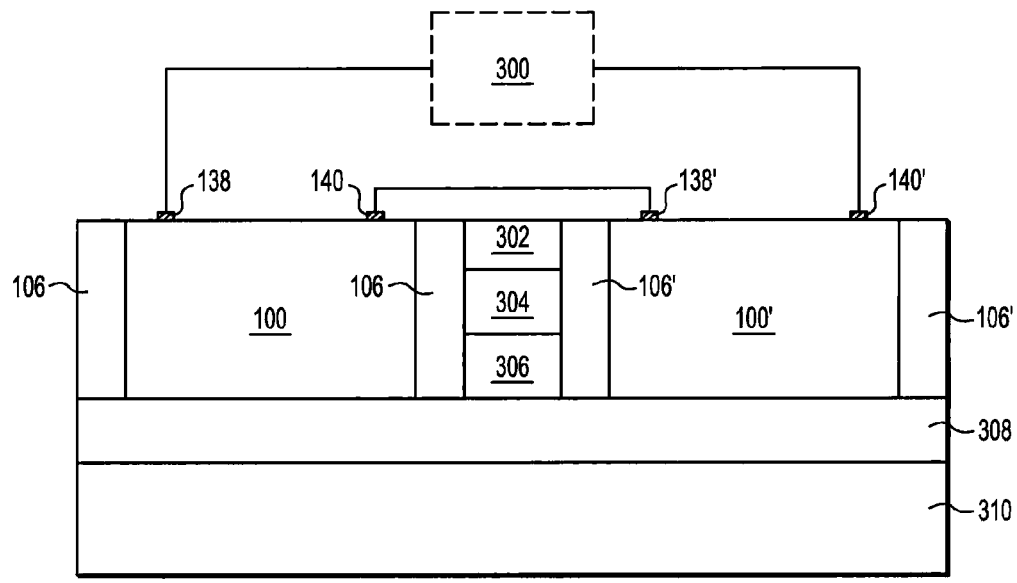
FIGS. 3A and 3B show cross-sectional views of an electrostatic discharge protection clamp including two stacked ESD protection devices.
Figure 3B:
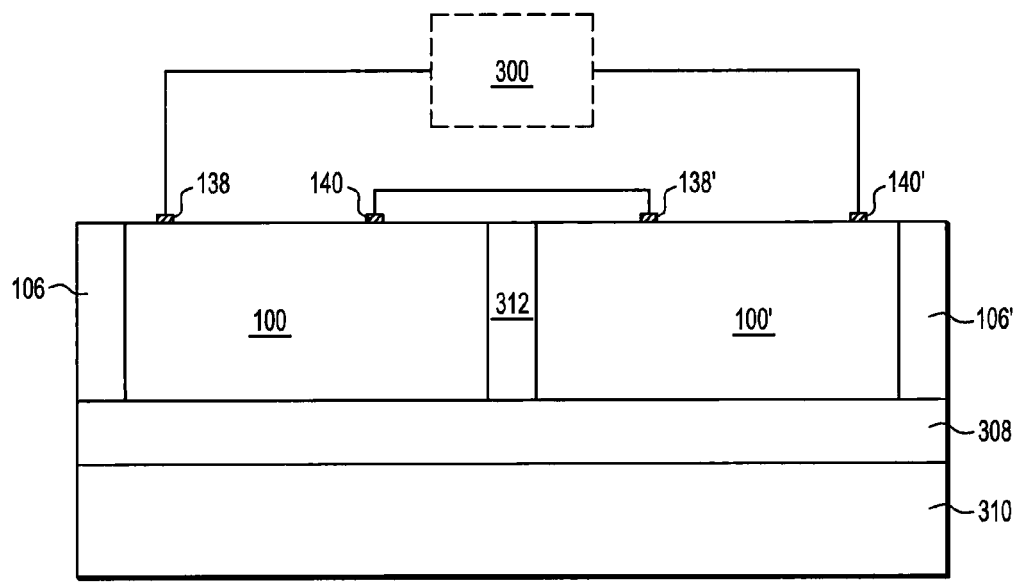

FIGS. 3A and 3B, for example, are cross-sectional views of an ESD protection clamp that includes two stacked ESD protection devices. In FIG. 3A two ESD protection devices 100 and 100' are connected in series, though other devices or clamps could include more than two series-connected ESD protection devices. In the arrangement shown in FIG. 3A, device 100' is the first ESD protection device in the stacked device and device 100 is the second ESD protection device.

Each of devices 100 and 100' in FIG. 3A are configured in accordance with the example device 100 shown in FIG. 2, however, the DTI regions 106 of each device have been duplicated in FIG. 3A. FIG. 3A also shows the substrate 310 and BOX layer 308 over which each ESD protection device is formed.

Each of the devices 100 and 100' are electrically isolated by DTI regions 106 (DTI regions 106 surround device 100 and DTI regions 106' surround device 100') from N type or P type region (formed by epitaxial deposition) 306 and in some embodiment P well region 304. STI structure 302 is provided for additional isolation.

To interconnect the devices, cathode 138' of device 100' is connected to anode 140 of device 100, thereby connecting devices 100 and 100' in series. The anode 140' of device 100' is connected to a first terminal (e.g., a positive terminal Vpos) of IC device 300. The cathode 138 of the stacked ESD protection device 100 is connected to a second terminal (e.g., a negative terminal Vneg) of IC device 300. In this configuration, the stacked ESD protection devices 100 and 100' operate as an ESD protection clamp to provide protection to IC device 300.

FIG. 3B is a cross-sectional view showing two stacked ESD protection devices 100 and 100', where the devices are isolated from one another using an alternative trench structure. In FIG. 3B, devices 100 and 100' of FIG. 3A are separated by a single DTI trench region 312 that provides electrical isolation between the two devices 100 and 100'. In this arrangement, device 100' is the first ESD protection device in the stacked arrangement and device 100 is the second ESD protection device.

Again, the cathode 138' of device 100' is connected to the anode 140 of device 100, connecting devices 100 and 100' in series. The anode 140' of device 100' is connected to a first terminal of IC device 300, where IC device 300 is to be protected by the stacked ESD protection device. The cathode 138 of the stacked ESD protection device 100 is connected to a second terminal of IC device 300.

Using the configuration shown in FIGS. 3A and 3B any number of ESD protection devices can be combined, in series, to form an ESD protection clamp. The anode of the first ESD protection device in the stack and the cathode of the last ESD protection device in the stack can then be connected to an IC device to provide protection thereto.

When two or more ESD protection devices are stacked as shown in FIG. 3A or FIG. 3B, the snapback voltage Vsb of the entire stacked device is equal to the sum of the snapback voltages of each of individual ESD protection devices 100. As such, to provide a protection device that targets a snapback voltage of 50V, a stack that includes three of the present ESD protection devices connected in series can be used. Because the Vsb of each individual ESD protection device is approximately 17.5V (in other implementations, Vsb of each individual ESD protection device varies from 14V to 30V or between 17V and 24V), the targeted value of 50 V can be met with three series-connected devices. This is in contrast to prior ESD protection devices that provide a Vsb of only 13V-15V in the same configuration. As a result, when using prior art ESD protection devices, a stack of four devices would be required to meet a 50V requirement. The number of the ESD protection devices in the stack can range from 1 to any number.

FIGS. 4A and 4B are graphs showing test results for a conventional double-stack ESD protection device including a full NBL and a double-stack ESD protection device configured in accordance with the present disclosure and including a partial NBL.

FIG. 4A shows the results of a DC sweep measurement comparing current flow through the two device stacks versus voltage. In FIG. 4A line 400 shows the forward DC sweep response of a conventional ESD protection device stack, while line 402 shows the forward DC sweep response of an ESD protection device stack with a partial NBL. As shown, both devices have a similar DC BV(V) of 43 shows at point 404.

FIG. 4B shows the test results of a transmission line pulse (TLP) comparing transient I-V response (406A, 408A) as well as the DC leakage current (406B, 408B) for the two device stacks in forward polarity. In FIG. 4B, line 406A shows the TLP I-V response of a conventional ESD protection device stack, while line 408A shows the TLP I-V response of the present ESD protection device stack using a partial NBL. As shown, the (forward) triggering voltage (Vt1) of both devices are comparable. The triggering voltage Vt1 of the conventional device stack is approximately 48.81V, while the triggering voltage Vt1 for the present device stack is approximately 49.81V. In this example, though, the present device stack demonstrates a significantly improved snapback voltage (Vsb). Here, the snapback voltage of the conventional device stack is approximately 29.83V, while the snapback voltage for the present device stack is approximately 34.92V. Additionally, the TLP test result shows that the current capability of the devices are comparable with an It2 of 5.28 A for the conventional device stack and an It2 of 5.89 A for the present device stack). Accordingly, a 16.7% increase in Vsb has been achieved with no significant affect on DC BV, Vt1, or the current capability of the stacked device.

Figure 5A:
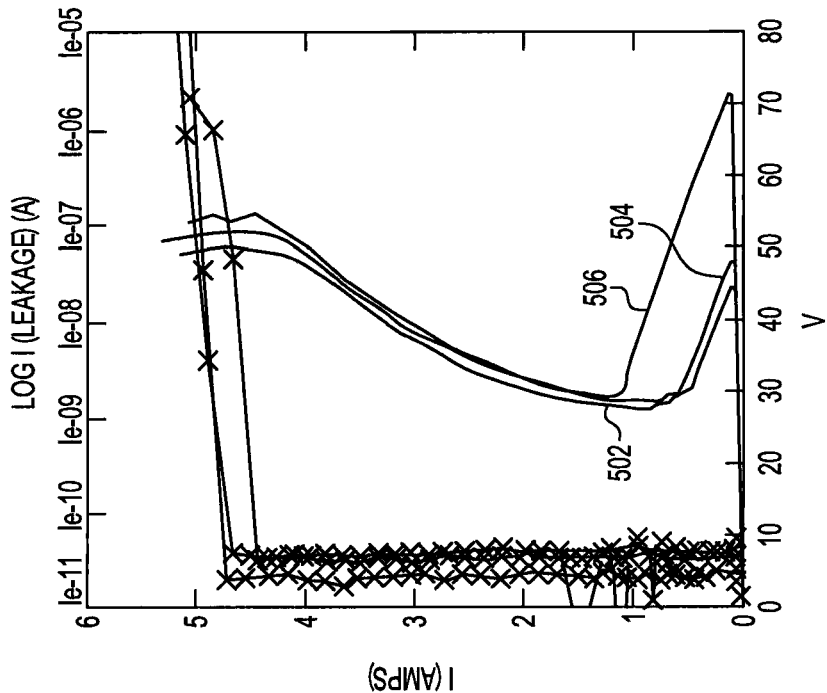
FIGS. 5A and 5B are graphs showing, respectively, measured current-voltage curves for forward polarity and reverse polarity transmission line pulses applied to stacked ESD protection devices configured in accordance with the present disclosure.
Figure 5B:
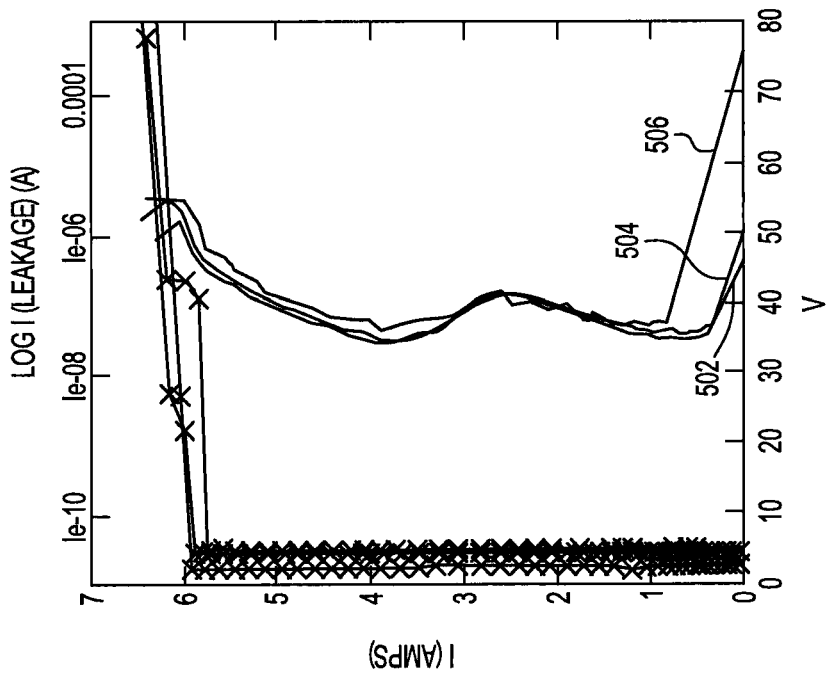

FIGS. 5A and 5B are graphs showing, respectively, current-voltage curves for forward polarity and reverse polarity transmission line pulses (TLP) applied to stacked ESD protection devices configured in accordance with the present disclosure. The stacked ESD protection devices under test include two stacked devices.

Here we use the forward triggering spacing D equal to $D_R$ reverse triggering spacing for all the devices in the stack. In each double-stack devices, the triggering spacings D and $D_R$ of the bottom ESD protection device in the stack was kept constant at a value of 0 µm. However, the triggering spacings D and $D_R$ of the top ESD protection device in the stack was varied, as described below.

In the first TLP test result, shown by line 502 in each of FIGS. 5A and 5B, the forward triggering spacing D and reverse triggering spacing $D_R$ of the top ESD protection device in the stack were 0 µm. In the second TLP test result, shown by line 504 in each of FIGS. 5A and 5B, the forward triggering spacing D and reverse triggering spacing $D_R$ of the top ESD protection device in the stack were 0.65 µm. In the third TLP test result, shown by line 506 in each of FIGS. 5A and 5B, the forward triggering spacing D and reverse triggering spacing $D_R$ of the top ESD protection device in the stack was 1.75 µm.

As illustrated by FIGS. 5A and 5B the device demonstrate good stability and dual-polarity operation. Additionally, the devices show good Vt1 controllability by adjusting the triggering spacing in the top ESD protection device of the device stack under both polarities.

For each device tested in FIGS. 5A and 5B, Table 1, below, shows the test results.

TABLE 1

| Top-stack Triggering Spacing D = $D_R$ | Bottom-stack Triggering Spacing D = $D_R$ | Forward Vt1 (Controlled by D) | Reverse Vt1($Vt1_R$) (Controlled by $D_R$) |
|---|---|---|---|
| 0 µm | 0 µm | 45.5 V | 44.6 V |
| 0.65 µm | 0 µm | 49.8 V | 48.2 V |
| 1.75 µm | 0 µm | 74.7 V | 71.5 V |

The device stacks in FIG. 5A and FIG. 5B are only examples. Dependent on varied applications, D and $D_R$ can be different. Vt1 and/or $Vt1_R$ of the device stacks can be adjusted by adjusting D and/or $D_R$ of 1 or more devices, and not limiting to the top device in the stack.

Figure 6:
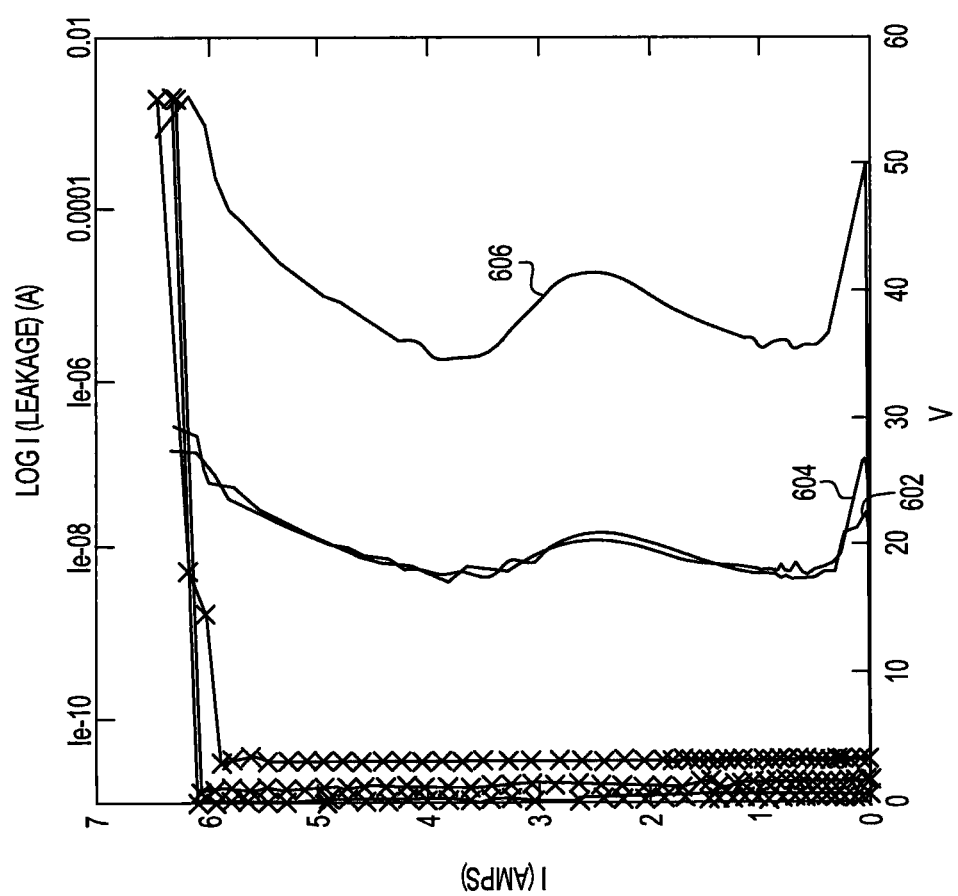
FIG. 6 is a graph showing test results for three devices including a single ESD protection device with triggering spacing D of 0 µm, a single ESD protection device with triggering spacing D of 0.65 µm, and device including two stacked ESD protection devices where the top device has triggering spacing D of 0.65 µm and the bottom device has triggering spacing D of 0 µm.

FIG. 6 is a graph showing test results for three devices including a single device with (forward) triggering spacing D of 0 µm, a single ESD protection device with (forward) triggering spacing D of 0.65 µm, and device including two stacked present ESD protection devices where the top device has (forward) triggering spacing D of 0.65 µm and the bottom device has (forward) triggering spacing D of 0 µm. For the TLP test results shown in FIG. 6, all ESD protection devices were configured in accordance with the present disclosure.

The results for the single ESD protection device having partial NBL and (forward) triggering spacing D of 0 µm are illustrated by line 602. As illustrated, that device has a (forward) Vt1 value of approximately 22.73 V and a snapback voltage of approximately 17.42 V.

The results for the single ESD protection device having partial NBL and (forward) triggering spacing D of 0.65 µm are illustrated by line 604. As illustrated, that device has a (forward) Vt1 value of approximately 26.76 V and a snapback voltage of approximately 17.31 V.

The results for the two stacked ESD protection device having partial NBL are illustrated by line 606. As illustrated, that device has a (forward) Vt1 value of approximately 49.81 V and a snapback voltage Vsb of approximately 34.92 V. Accordingly, the test results illustrated in FIG. 6 demonstrate that ESD protection devices constructed in accordance with the present disclosure demonstrate predictable stackability.

Although the present disclosure describes specific examples, embodiments, and the like, various modifications and changes can be made without departing from the scope of the present disclosure as set forth in the claims below. For example, although the exemplary methods, devices, and systems described herein are in conjunction with a configuration for the aforementioned device, the skilled artisan will readily recognize that the exemplary methods, devices, and systems may be used in other methods, devices, and systems and may be configured to correspond to such other exemplary methods, devices, and systems as needed. Further, while at least one embodiment has been presented in the foregoing detailed description, many variations exist. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all of the claims.

What is claimed is:

1. An electrostatic discharge protection clamp adapted to limit a voltage appearing across protected terminals of an integrated circuit to which the electrostatic discharge protection clamp is coupled, comprising:
    a substrate; and
    a first electrostatic discharge protection device formed over the substrate, the first electrostatic discharge protection device including:
        a buried layer formed over the substrate, the buried layer being non-contiguous over the substrate and being formed over a first region of the substrate and not being formed over a second region of the substrate, the buried layer having a first conductivity type,
        a device region formed over the substrate, the device region being in contact with the second region of the substrate and being separated from the first region of the substrate by the buried layer;

a first transistor formed in the device region, the first transistor being formed over the second region of the substrate and not being formed over the buried layer, the first transistor having an emitter coupled to a first cathode terminal of the electrostatic discharge protection clamp, and a second transistor formed in the device region, the second transistor being formed over the buried layer and the first region of the substrate, the second transistor having an emitter coupled to a first anode terminal of the electrostatic discharge protection clamp.

2. The electrostatic discharge protection clamp of claim 1, wherein the peak doping density of the buried layer is in the range of about $1\times10^{16}$ cm$^{-3}$ to about $1\times10^{19}$ cm$^{-3}$.

3. The electrostatic discharge protection clamp of claim 1, wherein the substrate includes a buried oxide layer.

4. The electrostatic discharge protection clamp of claim 3, wherein the buried oxide layer is configured to electrically isolate the first and second transistor from the substrate.

5. The electrostatic discharge protection clamp of claim 1, wherein at least one of the first transistor and the second transistor includes a bipolar junction transistor.

6. The electrostatic discharge protection clamp of claim 1, including a region of the first conductivity type forming a collector of the first transistor and a collector of the second transistor.

7. The electrostatic discharge protection clamp of claim 1, including:
    a first doped contact region forming the emitter of the first transistor;
    a second doped contact region forming a base of the first transistor;
    the second doped contact region and the first doped contact region being located in a doped well; and
    wherein the emitter of the first transistor and the base of the first transistor are electrically interconnected to form the cathode of the electrostatic discharge protection clamp.

8. The electrostatic discharge protection clamp of claim 1, including:
    a third doped contact region forming the emitter of the second transistor;
    a fourth doped contact region forming a base of the second transistor; and
    wherein the emitter of the second transistor and the base of the second transistor are electrically interconnected to form the anode of the electrostatic discharge protection clamp.

9. The electrostatic discharge protection clamp of claim 1, wherein a forward triggering voltage of the electrostatic discharge protection clamp is determined by a base-collector spacing of the first transistor.

10. The electrostatic discharge protection clamp of claim 1, wherein a reverse triggering voltage of the electrostatic discharge protection clamp is determined by a base-collector spacing of the second transistor.

11. The electrostatic discharge protection clamp of claim 1, including a second electrostatic discharge protection device formed over the substrate, the second electrostatic discharge protection device including a second cathode terminal, wherein the second cathode terminal is connected to the first anode terminal.

12. The electrostatic discharge protection clamp of claim 11, wherein:
    the buried layer is not formed over a third region of the substrate; and
    the second electrostatic discharge protection device includes:
        a third transistor formed over the third region of the substrate, the third transistor having an emitter coupled to the second cathode terminal; and
        a fourth transistor formed over the buried layer, the fourth transistor having an emitter coupled to the second anode terminal.

13. The electrostatic discharge protection clamp of claim 12, including a deep trench isolation structure between the first electrostatic discharge protection device and the second electrostatic discharge protection device.

14. A method of manufacturing an electrostatic discharge protection clamp adapted to limit a voltage appearing across protected terminals of an integrated circuit to which the electrostatic discharge protection clamp is coupled, comprising:
    providing a substrate including a buried layer, the buried layer being non-contiguous and being formed over a first region of the substrate and not being formed over a second region of the substrate, the buried layer having a first conductivity type;
    forming a device region over the substrate, the device region being in contact with the second region of the substrate and being separated from the first region of the substrate by the buried layer;
    forming a first transistor in the device region, the first transistor being formed over the second region of the substrate and not being formed over the buried layer, the first transistor having an emitter coupled to a cathode terminal of the electrostatic discharge protection clamp; and
    forming a second transistor in the device region, the second transistor being formed over the buried layer and the first region of the substrate, the second transistor having an emitter coupled to an anode terminal of the electrostatic discharge protection clamp.

15. The method of claim 14, wherein the peak doping density of the buried layer is in the range of about $1\times10^{16}$ cm$^{-3}$ to about $1\times10^{19}$ cm$^{-3}$.

16. The method of claim 14, wherein the substrate includes a buried oxide layer configured to electrically isolate the first and second transistor from the substrate.

17. The method of claim 14, wherein at least one of the first transistor and the second transistor includes a bipolar junction transistor.

18. The method of claim 14, wherein a forward triggering voltage of the electrostatic discharge protection clamp is determined by a base-collector spacing of the first transistor.

19. The method of claim 14, wherein a reverse triggering voltage of the electrostatic discharge protection clamp is determined by a base-collector spacing of the second transistor.

* * * * *